United States Patent
Oguri et al.

(10) Patent No.: US 9,523,529 B2
(45) Date of Patent: Dec. 20, 2016

(54) REFRIGERATION APPARATUS

(71) Applicant: DAIKIN INDUSTRIES, LTD., Osaka-shi, Osaka (JP)

(72) Inventors: Akihiko Oguri, Shanghai (CN); Junichi Teraki, Kusatsu (JP); Masanobu Kita, Kusatsu (JP); Hiroshi Doumae, Sakai (JP); Motonobu Ikeda, Sakai (JP); Masahide Fujiwara, Sakai (JP)

(73) Assignee: DAIKIN INDUSTRIES, LTD., Osaka-Shi (JP)

( * ) Notice: Subject to any disclaimer, the term of this patent is extended or adjusted under 35 U.S.C. 154(b) by 133 days.

(21) Appl. No.: 14/395,425

(22) PCT Filed: Apr. 8, 2013

(86) PCT No.: PCT/JP2013/002401
§ 371 (c)(1),
(2) Date: Oct. 17, 2014

(87) PCT Pub. No.: WO2013/157219
PCT Pub. Date: Oct. 24, 2013

(65) Prior Publication Data
US 2015/0128631 A1    May 14, 2015

(30) Foreign Application Priority Data

Apr. 20, 2012 (JP) ................................ 2012-096936

(51) Int. Cl.
*F25D 23/12* (2006.01)
*F25D 23/00* (2006.01)
(Continued)

(52) U.S. Cl.
CPC ............... *F25D 23/003* (2013.01); *F24F 1/22* (2013.01); *F24F 1/24* (2013.01); *F25D 19/00* (2013.01);
(Continued)

(58) Field of Classification Search
CPC .. F25D 23/003; H01L 23/367; H01L 23/4006; H01L 2023/405; H01L 2023/4068; H01L 2023/4087; H01L 23/473; H05K 7/20936; H05K 1/0272; H05K 1/0203; H05K 23/367; H05K 23/473; H05K 23/427; F24F 1/24; F28F 9/016; F25B 31/006; F25B 2600/021
See application file for complete search history.

(56) References Cited

U.S. PATENT DOCUMENTS

| 7,363,768 | B2 * | 4/2008 | Fuchikami | ................ F24F 1/20 62/259.2 |
| 2011/0036624 | A1 * | 2/2011 | Kagimura | ............ H05K 1/0263 174/260 |

(Continued)

FOREIGN PATENT DOCUMENTS

| EP | 2 306 101 A1 | 4/2011 |
| JP | 8-285331 A | 11/1996 |

(Continued)

OTHER PUBLICATIONS

International Search Report issued in PCT/JP2013/002401, dated Jun. 18, 2013.

*Primary Examiner* — Elizabeth Martin
(74) *Attorney, Agent, or Firm* — Birch, Stewart, Kolasch & Birch, LLP

(57) ABSTRACT

In a refrigeration apparatus, a main surface of a printed wiring board has a heavy electric region, which is a region in the lower part of the printed wiring board where a heavy electric component group is disposed, and a light electric (Continued)

region, which is a region positioned above the heavy electric region, where a light electric component group is disposed. A refrigerant jacket contacts a power device which is disposed in the heavy electric region. A liquid pipe of the refrigerant pipe includes a portion that extends upwards towards the refrigerant jacket, and a cooling portion contacts the refrigerant jacket.

5 Claims, 11 Drawing Sheets

(51) Int. Cl.
    *F24F 1/22*     (2011.01)
    *F24F 1/24*     (2011.01)
    *F25D 19/00*     (2006.01)
    *F28F 1/00*     (2006.01)
    *H01L 23/40*     (2006.01)
    *H01L 23/473*     (2006.01)
    *F28D 21/00*     (2006.01)

(52) U.S. Cl.
    CPC ............ *F28F 1/00* (2013.01); *H01L 23/4006* (2013.01); *H01L 23/473* (2013.01); *F28D 2021/0029* (2013.01); *F28F 2275/08* (2013.01); *H01L 2924/0002* (2013.01)

(56) References Cited

U.S. PATENT DOCUMENTS

| 2011/0072833 A1* | 3/2011 | Koyama ............... F25B 31/006 |
| | | 62/3.1 |
| 2011/0079033 A1* | 4/2011 | Okuda ...................... F24F 1/22 |
| | | 62/259.2 |

FOREIGN PATENT DOCUMENTS

| JP | 11-23075 A | 1/1999 |
| JP | 2009-299975 A | 12/2009 |
| JP | 2010-117107 A | 5/2010 |
| JP | 2010-175231 A | 8/2010 |
| JP | 2011-033340 A | 2/2011 |
| JP | 2011-99577 A | 5/2011 |
| WO | WO 2011/083756 A1 | 7/2011 |

\* cited by examiner

REFRIGERATION APPARATUS

TECHNICAL FIELD

The present invention relates to a refrigeration apparatus provided with a refrigerant jacket for cooling a power device.

BACKGROUND ART

An air-conditioning apparatus is known as a refrigeration apparatus provided with a refrigerant jacket for cooling a power device (for example, Patent Literature 1). The refrigeration apparatus in Patent Literature 1 is provided with an electric component module having a printed circuit board held on a front surface side of a holding member (front surface-side circuit board) and a printed circuit board held on a rear surface side of the holding member (rear surface-side circuit board). In this refrigeration apparatus, a refrigerant jacket and refrigerant pipes are disposed in front of the electric component module in order to cool a power device in the electric component module.

However, an electric component module in which a plurality of electronic components are installed in a divided fashion on the front surface side and the rear surface side of a holding member, as in Patent Literature 1, has a large size in the front/rear direction (the thickness direction of the printed circuit board). Moreover, when using a refrigeration jacket to cool a power device, since a refrigeration jacket and a refrigeration pipe is disposed in front of the electric component module, then the size in the front/rear direction (the thickness direction) becomes even larger. Consequently, there are increased space restrictions inside the casing of the refrigeration apparatus in order to arrange a variety of devices other than the electric component module and the refrigerant jacket.

CITATION LIST

Patent Literature

Patent Literature 1: Japanese Unexamined Patent Publication No. 2010-175231

SUMMARY OF INVENTION

The object of the present invention is to suppress increase in space restrictions for arranging various devices inside a casing, in a refrigeration apparatus provided with a refrigeration jacket for cooling a power device.

The present invention relates to a refrigeration apparatus having a refrigerant circuit. The refrigeration apparatus includes: a heavy electric component group including a power device; a light electric component group; a printed wiring board, on one main surface of which the heavy electric component group and the light electric component group are mounted, the printed wiring board being disposed in a vertical direction; a refrigerant pipe through which a refrigerant of the refrigerant circuit flows; and a refrigerant jacket cooling the power device by a refrigerant flowing in a cooling portion which is one portion of a liquid pipe of the refrigerant pipe. The main surface of the printed wiring board includes: a heavy electric region which is a region in a lower part of the printed wiring board where the heavy electric component group is disposed; and a light electric region which is a region situated above the heavy electric region, where the light electric component group is disposed. The refrigerant jacket contacts the power device arranged in the heavy electric region. The refrigerant pipe extends upwards towards the refrigerant jacket, and the cooling portion contacts the refrigerant jacket.

DESCRIPTION OF EMBODIMENTS

Below, a refrigeration apparatus relating to an embodiment of the present invention will be described with reference to the drawings. In the embodiment described below, an example is given in which the refrigeration apparatus is an air-conditioning apparatus 1.

<Air-Conditioning Apparatus>

Figure 1:
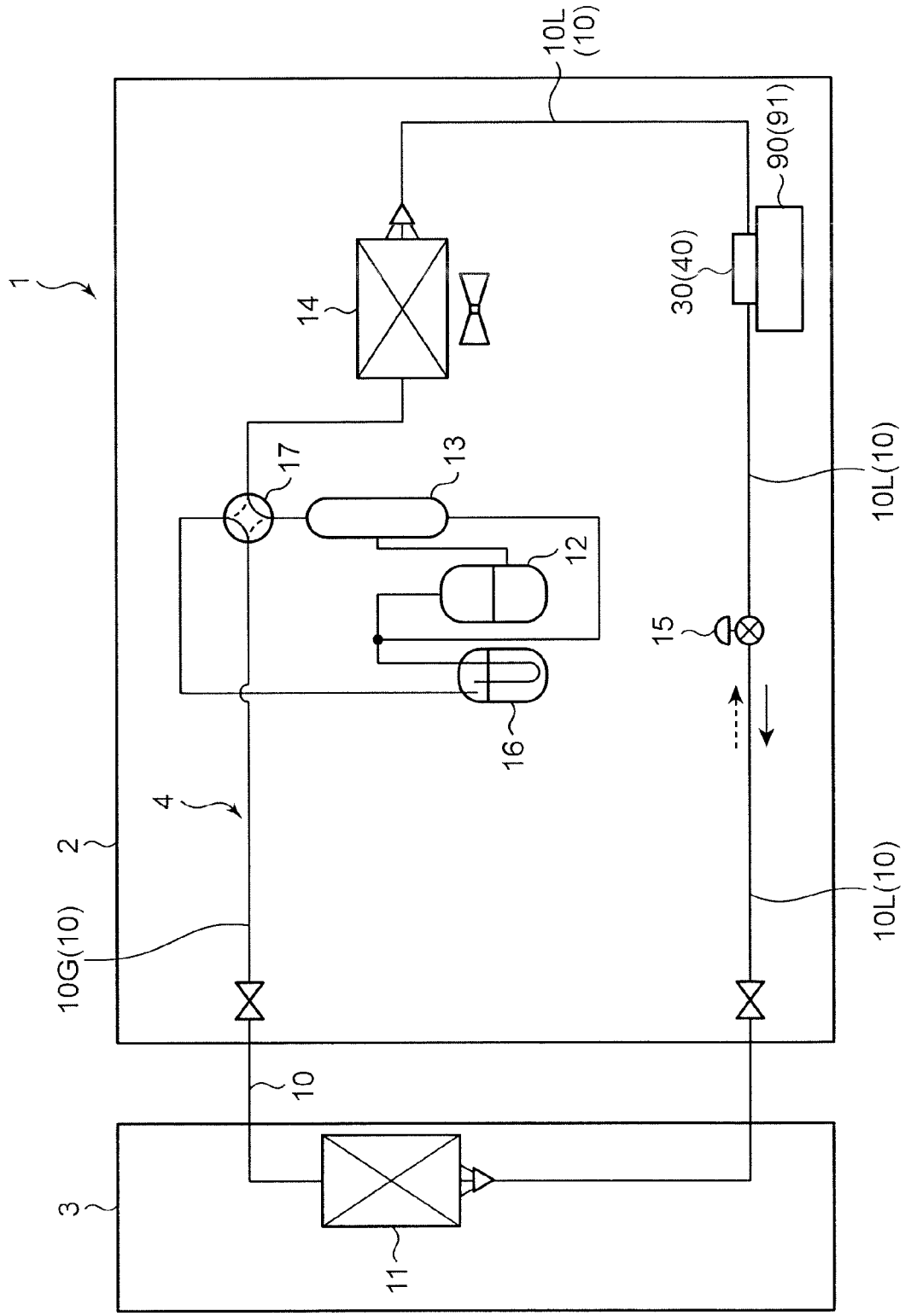
FIG. 1 is a view showing a schematic composition of the air-conditioning apparatus which is a refrigeration apparatus relating to one embodiment of the present invention.

As shown in FIG. 1, the air-conditioning apparatus 1 is provided with an outdoor unit 2 which is disposed outdoors, and an indoor unit 3 which is disposed indoors. The outdoor unit 2 and the indoor unit 3 are mutually connected by connection pipes. The air-conditioning apparatus 1 is provided with a refrigerant circuit 4 which carries out a vapor compression refrigeration cycle. The refrigerant circuit 4 principally includes an indoor heat exchanger 11, a compressor 12, an oil separator 13, an outdoor heat exchanger 14, an expansion valve 15, which is an expansion mechanism, an accumulator 16, and a four-way switching valve 17, and these are connected by a refrigerant pipe 10 in which the refrigerant of the refrigerant circuit 4 flows. The refrigerant pipe 10 includes a liquid pipe 10 and a gas pipe 10G.

The indoor heat exchanger 11 is a heat exchanger for the refrigerant to exchange heat with the indoor air, and is provided in the indoor unit 3. For the indoor heat exchanger 11, it is possible to use, for example, a cross-fin type of fin-and-tube heat exchanger, or the like. An indoor fan (not illustrated) for blowing the indoor air to the indoor heat exchanger 11 is provided in the vicinity of the indoor heat exchanger 11.

The compressor 12, the oil separator 13, the outdoor heat exchanger 14, the expansion valve 15, the accumulator 16 and the four-way switching valve 17 are provided in the outdoor unit 2. These elements are all accommodated inside a casing 5 (see FIG. 2).

The compressor 12 has an intake port, a compression mechanism and a discharge port, and refrigerant that has been sucked in via the intake port is compressed by the compression mechanism and is discharged from the discharge port. It is also possible to use various compressors, such as a scroll compressor, or the like, as the compressor 12.

The oil separator 13 serves to separate lubricating oil from the mixed fluid of lubricating oil and refrigerant which is discharged from the compressor 12. The separated refrigerant is sent to the four-way switching valve 17 and the lubricating oil is returned to the compressor 12.

The outdoor heat exchanger 14 serves for the refrigerant to exchange heat with the outdoor air, and may use, for example, a cross-fin type of fin-and-tube heat exchanger, or the like. An outdoor fan for blowing the outdoor air to the outdoor heat exchanger 14 is provided in the vicinity of the outdoor heat exchanger 14.

The expansion valve 15 is disposed between the outdoor heat exchanger 14 and the indoor heat exchanger 11 in the refrigerant circuit 4, and causes the refrigerant flowing into same to expand and decompress to a prescribed pressure. It is possible to adopt a variable-opening electronic expansion valve 15, for example, as the expansion valve 15.

The accumulator 16 performs gas/liquid separation of the refrigerant that has flowed into same, and is disposed between the intake port of the compressor 12 and the four-way switching valve 17 in the refrigerant circuit 4. The gas refrigerant which is separated in the accumulator 16 flows into the compressor 12.

Four ports, a first port to a fourth port, are provided in the four-way switching valve 17. The four-way switching valve 17 is capable of switching between a first state of communicating between the first port and the third port, while simultaneously communicating between the second port and the fourth port (the state indicated by the solid lines in FIG. 1), and a second state of communicating between the first port and the fourth port, while simultaneously communicating between the second port and the third port (the state indicated by the broken lines in FIG. 1). The first port is connected to the discharge port of the compressor 12 via the oil separator 13, the second port is connected to the intake port of the compressor 12 via the accumulator 16, the third port is connected to the outdoor heat exchanger 14, and the fourth port is connected to the indoor heat exchanger 11 via a connection pipe. When the air-conditioning apparatus 1 is performing a cooling operation, the four-way switching valve 17 is switched to the first state, and when performing a heating operation, the four-way switching valve 17 is switched to the second state.

A portion of the refrigerant pipe 10 of the refrigerant circuit 4 (the cooling portion 10A) is installed on the refrigerant jacket 40 for cooling the power device 20 of the printed circuit board 91 which is described below. In the present embodiment, taking account of the cooling properties, the liquid pipe, of the refrigerant pipe 10, is installed in the refrigerant jacket 40, as shown in FIG. 1. In the present embodiment, the liquid pipe installed in the refrigerant jacket 40 is a liquid pipe between the outdoor heat exchanger 14 and the expansion valve 15 in the refrigerant circuit 4, but the liquid pipe installed in the refrigerant jacket 40 is not limited to this.

During a cooling operation, the refrigerant that has been condensed in the outdoor heat exchanger 14 flows in the liquid pipe installed in the refrigerant jacket 40, and during a heating operation, refrigerant that has been condensed by the indoor heat exchanger 11 and has been decompressed by the expansion valve 15 flows in the liquid pipe installed in the refrigerant jacket 40. The temperatures of these refrigerants vary depending on the operating conditions, and so on, but during a heating operation is approximately 40° C. to 45° C.

<Outdoor Unit>

Figure 2:
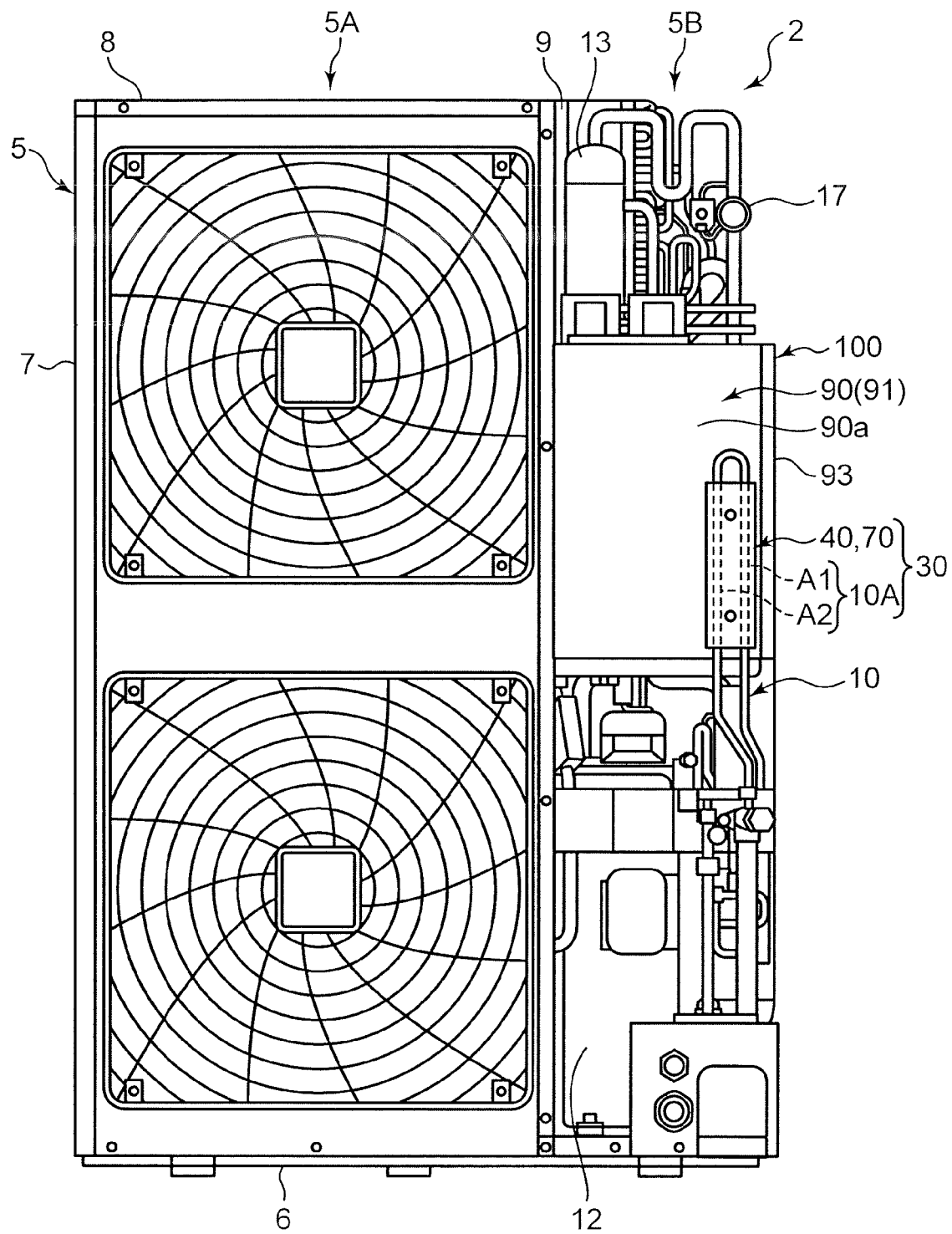
FIG. 2 is a front view showing an outdoor unit of the air-conditioning apparatus and shows a state in which a portion of the casing has been removed.

As shown in FIG. 2, the outdoor unit 2 is provided with a casing 5. The abovementioned compressor 12, oil separator 13, outdoor heat exchanger 14, expansion valve 15, accumulator 16, four-way switching valve 17, and the like, are accommodated inside the casing 5.

The casing 5 has a bottom plate 6, a side plate 7 which is erected upwardly at the peripheral portion of this bottom plate 6, and a ceiling plate 8 which is disposed on the upper end portion of the side plates 7, and overall has a substantially cuboid-shaped external appearance. A dividing plate 9 which divides the internal space of the casing 5 into two spaces is provided in the outdoor unit 2. This dividing plate 9 has a size reaching from the lower end portion to the upper end portion of the space inside the casing 5, and is erected on the bottom plate 6 of the casing 5. Due to this dividing plate 9, the space inside the casing 5 is divided into a heat exchange chamber 5A in which the outdoor heat exchanger 14 and the outdoor fins are accommodated, and a machine chamber 5B in which the compressor 12 and the electric component module 100, and the like, are accommodated. A blowing port for blowing out the air in the heat exchange chamber 5A, to outside the casing 5, is opened on the front surface of the casing 5.

The machine chamber 5B occupies a portion of the space inside the casing 5 (in the case of the embodiment shown in FIG. 2, the right-hand-side portion when the casing 5 is viewed from the front side). An electric component module 100 is disposed on the side of the opening which appears when a portion of the casing 5 that covers the machine chamber 5B is removed (the front side in the present embodiment). In the present embodiment, as shown in FIG. 2, one portion of the front surface of the casing 5 is opened by removing a portion of the front surface side plate of the casing 5 (the right-side portion of the front surface side plate is removed in FIG. 2). The electric component module 100 is disposed on the front side inside the machine chamber 5B.

The electric component module 100 is an electric component assembly for controlling the operation of the refrigerant circuit 4. The electric component module 100 is disposed in the vicinity of the front surface side plate such that the front surface of the electric component module 100 is substantially parallel to the front surface side plate on the front side of the casing 5. Consequently, when the portion of the front surface side plate of the casing 5 is removed during servicing, or the like, then the front surface of the electric component module 100 is exposed to the front side, as shown in FIG. 2.

In the present embodiment, the electric component module 100 is disposed in an intermediate portion of the height direction in the machine chamber 5B, but is not limited to this. The areas above and below the electric component module may be empty spaces, or may be used to dispose other components. The electric component module 100 is supported by (fixed on) the dividing plate 9 and the side plates of the casing 5, for example. The electric component module 100 includes a printed circuit board 91, a refrigerant jacket 40 and a temperature detection unit T. In the present embodiment, the electric component module 100 is also provided with a supporting member 93, which is provided on the rear surface side of the printed circuit board 91 and supports the printed circuit board 91, and a pressing plate 70.

The temperature detection unit T is fixed to the refrigerant jacket 40, the refrigerant jacket 40 is fixed to the printed circuit board 91, the printed circuit board 91 is supported by the supporting member 93, and the supporting member 93 is supported by the casing 5. Therefore, the electric component module 100 is supported by the casing 5.

<Cooling Structure of Power Device>

Next, a structure for cooling the power device 20 will be described. In the cooling structure of the present embodiment, the cooler 30 cools the power device 20 of the printed circuit board 91. The cooler 30 includes a refrigerant jacket 40, and a cooling portion 10A, which is a portion of the refrigerant pipe 10. In the present embodiment, the cooler 30 further includes a pressing plate 70 which is installed on the refrigerant jacket 40. The cooler 30 is described below.

(Printed Circuit Board)

Figure 3:
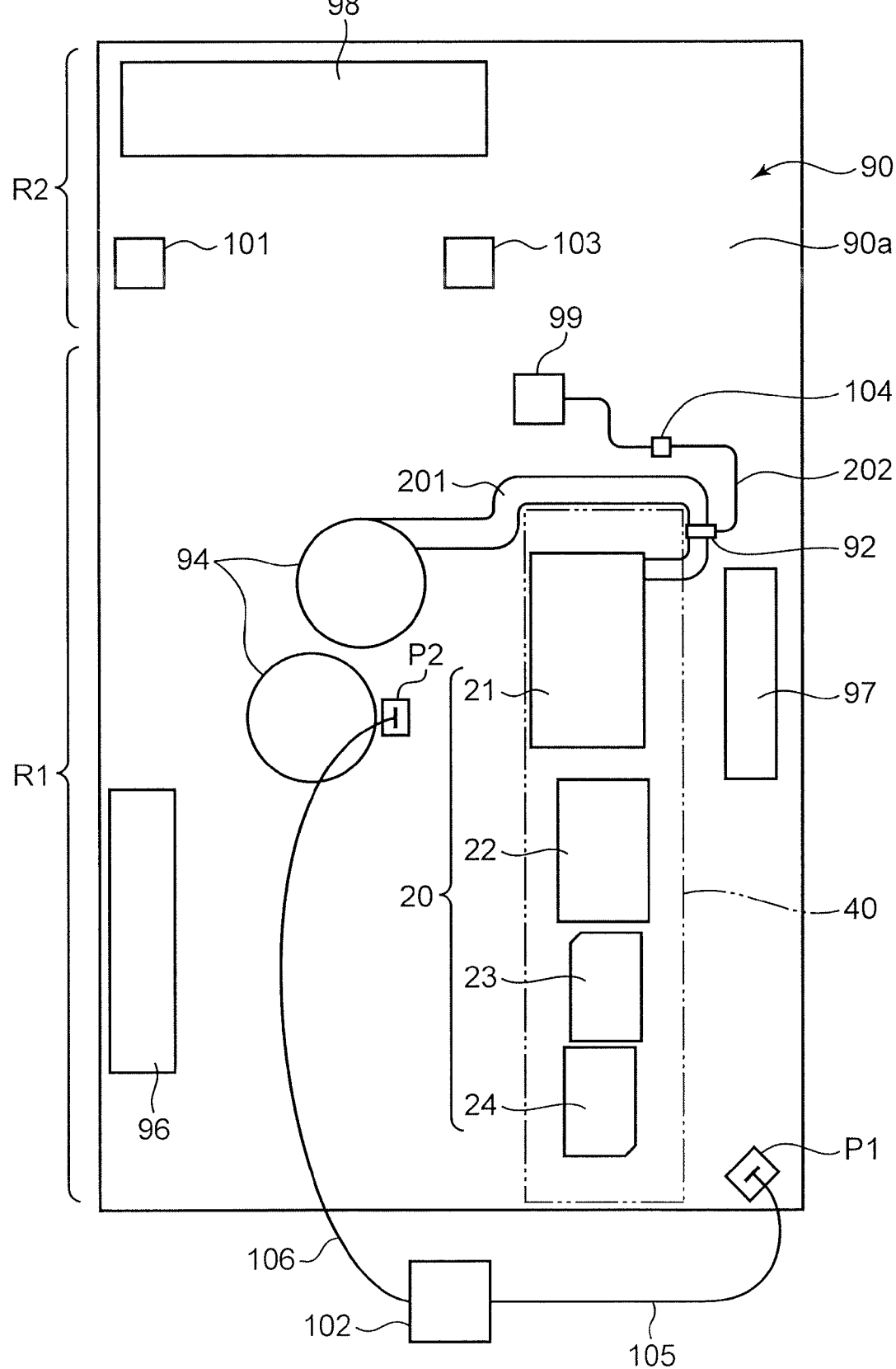
FIG. 3 is a front view showing a printed circuit board in the outdoor unit.

Firstly, the composition of the printed circuit board 91 will be described. As shown in FIG. 2 and FIG. 3, the printed circuit board 91 includes various electronic components, and a printed wiring board 90 on which these electronic components are mounted. The printed wiring board 90 has a main surface (front surface) 90a which faces the side of an opening that appears when a portion of the casing 5 (a portion of the front surface side plate in the present embodiment) is removed. The printed wiring board 90 is supported by the supporting member 93 in an upright state. The printed wiring board 90 is disposed in the vertical direction. In the present embodiment, the printed wiring board 90 is disposed in an attitude that is parallel to the vertical direction, but the invention is not limited to this. A state where the printed wiring board 90 is disposed in the vertical direction does not just mean a case where the printed wiring board 90 is disposed in an attitude parallel to the vertical direction, and also includes cases where the board is disposed in an attitude slightly inclined with respect to the vertical direction. The electronic component includes a heavy electric component group, and a light electric component group.

The heavy electric component group includes a plurality of components of a power system for drive power control (electric power control) and electric power conversion, and so on. More specifically, for example, the heavy electric component group includes power system components, such as: a power device 20, a capacitor 94 such as a large-capacity electrolytic capacitor, an input wire section 96 for a power source E (see FIG. 4), an output wire section 97 for an inverter, a calculation unit (microcomputer) 99 for controlling these components, a shunt resistance 92, and an operational amplifier 104, and the like. In the present embodiment, the power device 20 includes a first inverter 21 for controlling the compressor, a second inverter 22 for controlling the fan motor, a first converter 23 for controlling the compressor and a second converter 24 for controlling the fan motor. Possible examples of the inverters 21, 22 are semiconductor switching elements, such as IGBTs (Insulated Gate Bipolar Transistors).

The light electric component group includes a plurality of components of a communications system and a signal system, such as switches, connectors and other operational elements, and LEDs and other display elements. More specifically, for example, the light electric component group includes a setting switch (service switch) 98, a setting switch 101 for switching between applicability and non-applicability of standby power control, a calculation unit (microcomputer) 103 for controlling the light electric components, and the like, as shown in FIG. 3.

In the setting switch 101, if the indoor unit is applicable for standby power control, then the setting switch 101 is set to "applicable" and control for lowering the electric power during standby is implemented. On the other hand, if the indoor unit is not applicable for standby power control, then the setting switch 101 is set to "not applicable".

As shown in FIG. 3, the setting switch 98 is disposed in an edge portion (upper edge portion) of the printed wiring board 90, and therefore has excellent operability during servicing. Furthermore, the setting switch 101 is disposed in an edge portion (side edge portion) of the printed wiring board 90, and therefore has excellent operability during servicing.

Figure 4:
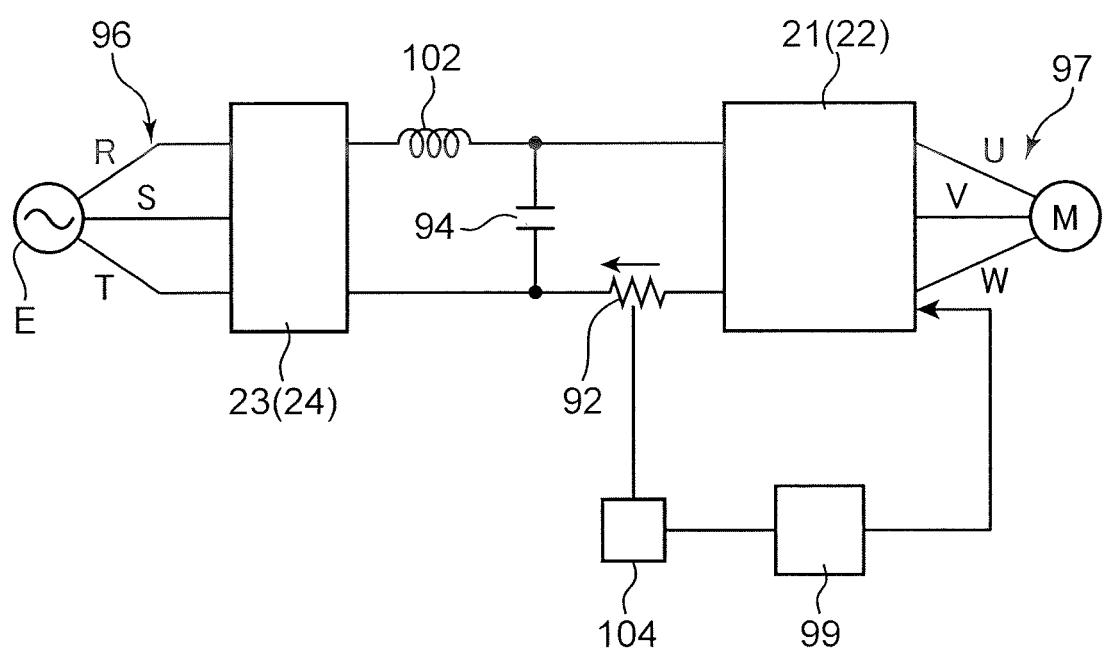
FIG. 4 is a control circuit diagram showing a control circuit for controlling a load.

FIG. 4 shows a control circuit diagram for controlling a load M. FIG. 4 depicts a control circuit which controls the motor of the compressor, but the control circuit which controls the fan motor has a similar configuration. As shown in FIG. 4, in this control circuit, a three-phase (R phase, S phase and T phase) AC power source (input current) is input to the input wire section 96 from the power source E, which is a commercial power source, for instance. This input current is converted to DC current in the converter 23. This DC current is converted to a drive current of the desired three phases (U phase, V phase and W phase) in the inverter 21, and is output to the load M (compressor motor).

In the control circuit, a reactor 102 and the capacitor 94 are provided between the converter 23 and the inverter 21, the DC current output from the converter 23 is smoothed, and this smoothed current is input to the inverter 21. In the present embodiment, the reactor 102 is not mounted on the printed wiring board 90, but rather is provided near to the printed circuit board 91 inside the casing 5.

The shunt resistance 92 serves to detect the current flowing therein (the output current output to the inverter 21). The shunt resistance 92 is connected in series between the earth side of the capacitor 94 and the earth side of the inverter 21. The current detection signal detected by the shunt resistance 92 is amplified by the operational amplifier 104, and is then input to the microcomputer 99. The microcomputer 99 adjusts the output current from the inverter 21 on the basis of the input current detection signal. Consequently, the motor of the compressor is controlled. As stated above, the control implemented to control the fan motor is similar to the motor control of the compressor which is described above.

Next, the layout of the electronic components, and the like, in the printed circuit board 91 will be described. As shown in FIG. 3, in the main surface 90a of the printed wiring board 90, the heavy electric component group is disposed in the region R1 in the lower part of the printed wiring board 90 (the heavy electric region R1), and the light electric component group is disposed in the region R2 which is above the heavy electric region (the light electric region R2). By dividing the heavy electric region and the light electric region in this way, the light electric components are not liable to be affected adversely by the heavy electric components.

The input wire section 96 is disposed on one side of the power device 20 (the left-hand side of the power device 20 in FIG. 3), and the output wire section 97 is disposed on the other side of the power device 20 (the right-hand side of the power device 20 in FIG. 3). The noise reduction effects can be improved by separating the input wire section 96 for the power source and the output wire section 97 for the inverter in this way. In a case where the abovementioned arrangement is employed, the route of a power system wiring pattern can be made short.

Furthermore, in the present embodiment, the input wire section 96 is disposed in the side edge portion on one side of the printed wiring board 90, and the output wire section 97 is disposed on the side edge portion on the other side of the printed wiring board 90. Consequently, the working efficiency of tasks such as connecting other wires to the input wire section 96 and the output wire section 97 on a production line is improved.

The inverters 21, 22 and the converters 23, 24 are aligned in one row along one direction, on the main surface 90a of the printed wiring board 90. If the inverters 21, 22 and the converters 23, 24 are arranged in one row in this way, then the refrigerant jacket is formed in a long thin shape so as to correspond to this row. In the present embodiment, it is possible to achieve efficient manufacture by extrusion molding of the jacket main body of the long thin refrigeration jacket, as described hereinafter. In the present embodiment, the first inverter 21, the second inverter 22, the first converter 23 and the second converter 24 are aligned in one row in the vertical direction, and are arranged in this order from the top.

FIG. 3 shows a wiring pattern 201 between the earth side of the capacitor 94 and the earth side of the inverter 21, and a wiring pattern 202 which links the shunt resistance 92, the operational amplifier 104 and the microcomputer 99. Other wiring patterns are omitted in this figure.

The wiring pattern 201 is formed at substantially the same position on the opposite surface (rear surface) of the main surface 90a, in addition to being formed on the main surface 90a of the printed wiring board 90, as shown in FIG. 3. The wiring pattern 202 is formed on the main surface 90a of the printed wiring board 90. The wiring patterns 201, 202 can be formed by printing a conductor pattern of copper, or the like, onto the surface of an insulating substrate, for example.

The wiring pattern 202 leads the current detection signal detected in the shunt resistance 92, to the microcomputer 99. In the present embodiment, as shown in FIG. 3, the wiring pattern 202 for the current detection signal which links the shunt resistance 92 and the operational amplifier 104 is provided so as not to intersect with the wiring pattern 201 which links the capacitor 94 and the inverter 21.

Normally, the current detection signal is a signal of low voltage, which is susceptible to the effects of the current of the heavy electric system (power system) which is flowing in the wiring pattern 201. Supposing that the wiring pattern 202 for the current detection signal were to be provided so as to intersect with the wiring pattern 201 for the power system, then the current detection signal would be greatly affected by the power system and become liable to include noise.

On the other hand, in the present embodiment, as described above, the wiring pattern 202 for the current detection signal is provided so as not to intersect (cross) with the wiring pattern 201 for the power system, and therefore it is possible to suppress the inclusion of noise in the current detection signal. A situation where the wiring pattern 201 and the wiring pattern 202 do not intersect means a case where both the wiring pattern 201 and the wiring pattern 202 are formed on the main surface 90a of the printed wiring board 90 and these wiring patterns 201, 202 are not mutually overlapping, but rather are provided at mutually separate positions, or a case where the wiring pattern 201 is formed on the main surface 90a of the printed wiring board 90, for example, the wiring pattern 202 is formed on the surface on the opposite side to the main surface 90a of the printed wiring board 90 (the other main surface), and when the printed circuit board 91 is viewed from the front side (when viewed in the direction indicated in FIG. 3), then the wiring patterns 201, 202 do not overlap with each other.

Furthermore, a situation where the wiring pattern 201 and the wiring pattern 202 intersect (cross) each other, means a case where, when the printed circuit board 91 is viewed from the front side (when viewed in the direction indicated in FIG. 3), at least a portion of the wiring pattern 202 formed on the main surface 90a and at least a portion of the wiring pattern 201 formed on the opposite surface from the main surface 90a (the other main surface) are mutually overlapping.

The gate signal (PWM waveform) which is the inverter drive signal has a higher voltage than the current detection signal and is not liable to be affected by the current of the heavy electric system. Therefore, the wiring pattern for the gate signal (not illustrated) may intersect with the wiring pattern 201.

Furthermore, as shown in FIG. 3, in the present embodiment, the reactor 102 is connected to the converters 23, 24 and capacitors 94 by harnesses 105, 106. More specifically, the current output from the converter 23 (24) is input to the first terminal P1. This first terminal P1 and the reactor 102 are connected by the first reactor harness 105. Furthermore, the current output from the reactor 102 is input to the second terminal P2 via the second reactor harness 106 and is further input from this second terminal P2, to the capacitor 94.

In the present embodiment, both the heavy electric component group and the light electric component group are arranged on one main surface 90a of the printed wiring board 90, and hence there are large restrictions on the arrangement of the wirings (wiring patterns) which connect the heavy electric components, in particular. Therefore, in the present embodiment, there is a portion where the heavy electric components are connected by a harness. More specifically, the reactor 102 is connected to the converters 23, 24 and the capacitors 94 by a first reactor harness 105 and a second reactor harness 106. Consequently, it is possible to simplify the wiring pattern on the printed circuit board 91.

In particular, if large components, such as the refrigerant jacket 40, are installed on the printed wiring board 90, as in the present embodiment, then there are extremely large restrictions on the arrangement of the wirings (wiring patterns) which connect the heavy electric components, and therefore a structure which connects the reactor 102 to the converters 23, 24 and the capacitors 94 via the harnesses 105, 106 is especially effective.

Moreover, if a layout is adopted in which the second terminal P2 and the capacitor 94 are arranged on one side of the power device 20 (on the left side of the power device 20 in FIG. 3), and the first terminal P1 to which the output of the converter 23 is input is arranged on the other side (the right side of the power device 20 in FIG. 3), as in the present embodiment, (namely, if the power device 20 and the refrigerant jacket 40 are interposed between the first terminal P1 and the second terminal P2), then the wiring pattern is liable to become complicated if it is attempted to connect the first terminal P1, the reactor 102 and the second terminal P2 on the printed wiring board 90. Consequently, a structure which connects the reactor 102 to the converters 23, 24 and the capacitors 94 by the harnesses 105, 106 is especially effective.

Furthermore, if the refrigerant jacket 40 is installed on the printed circuit board 91 as in the present embodiment, then the arrangement of the power device 20 is restricted to a certain extent, and therefore the layout design becomes more difficult and the separation between the heavy electric components and the light electric components becomes difficult to achieve. Therefore, in the present embodiment, by adopting the layout described above, on the main surface 90a of the printed wiring board 90, it is possible to suppress increase in the space restrictions for arranging various devices inside the casing, while ensuring cooling properties by the refrigerant jacket 40.

Next, the power device 20 will be described in detail.

Figure 5:
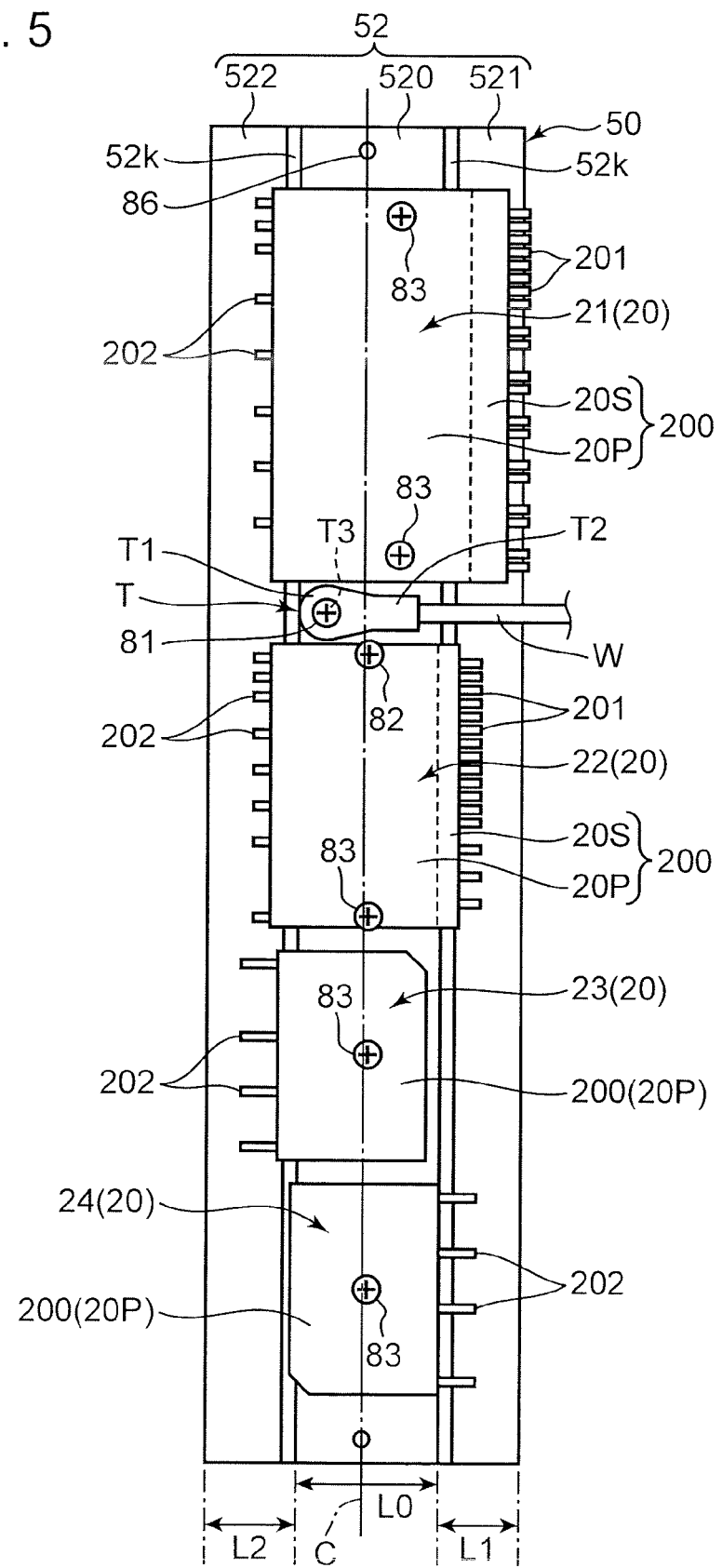
FIG. 5 is a rear view showing a state where a power device and a temperature detection unit are mounted on a facing surface of a refrigeration jacket.

As shown in FIG. 5, the first inverter 21 has a device main body 200, a first lead section 201, and a second lead section 202. The device main body 200 has a signal part 20S which is positioned on the side of the first lead section 201, and a heavy electric part 20P which is positioned on the side of the second lead section 202 and which is more liable to generate heat than the signal part 20S. The first lead section 201 is connected to the signal part 20S and the second lead section 202 is connected to the heavy electric part 20P. The approximate boundary between the signal part 20S and the heavy electric part 20P is indicated by the broken lines in FIG. 5.

Similarly, the second inverter 22 has a device main body 200, a first lead section 201, and a second lead section 202. The device main body 200 has a signal part 20S which is positioned on the side of the first lead section 201, and a heavy electric part 20P which is positioned on the side of the second lead section 202 and which is more liable to generate heat than the signal part 20S. The first lead section 201 is connected to the signal part 20S and the second lead section 202 is connected to the heavy electric part 20P. The approximate boundary between the signal part 20S and the heavy electric part 20P is indicated by the broken lines in FIG. 5.

The first lead section 201 of the first inverter 21 and the first lead section 201 of the second inverter 22 are each extended towards the printed wiring board 90 from one side of the device main body 200 and are each connected to the printed wiring board 90. The second lead section 202 of the first inverter 21 and the second lead section 202 of the second inverter 22 are each extended towards the printed wiring board 90 from the other side of the device main body 200 and are each connected to the printed wiring board 90.

The first converter 23 has a device main body 200 and a lead section 202. Similarly, the second converter 24 has a device main body 200 and a lead section 202. Substantially the whole of the device main bodies 200 of the first converter 23 and the second converter 24 is composed by a heavy electric part (20P) which is liable to generate heat.

(Cooler)

Below, the cooler 30 is described. As mentioned above, the cooler 30 according to the present embodiment includes the refrigerant jacket 40, the cooling portion 10A of the refrigerant pipe 10, and the pressing plate 70 which is installed on the refrigerant jacket 40.

The cooling portion 10A constitutes one portion of the refrigerant pipe 10. Refrigerant at a temperature capable of cooling the power device 20 flows in the cooling portion 10A. In the present embodiment, as shown in FIG. 1, the cooling portion 10A is one portion of a liquid pipe 10L which is positioned between the outdoor heat exchanger 14 and the expansion valve 15. In the present embodiment, one portion of the liquid pipe 10L has a shape bent into a U-shaped form, as shown in FIG. 2, and this U-shaped portion functions as a cooling portion 10A. The end section (curved section) of the U-shaped portion is positioned outside the refrigerant jacket 40. Furthermore, in the present embodiment, one portion of the liquid pipe 10L is disposed in such a manner that the curved section (the end section) of the U-shaped portion in the casing 5 is situated uppermost, but the invention is not limited to this.

Figure 6:
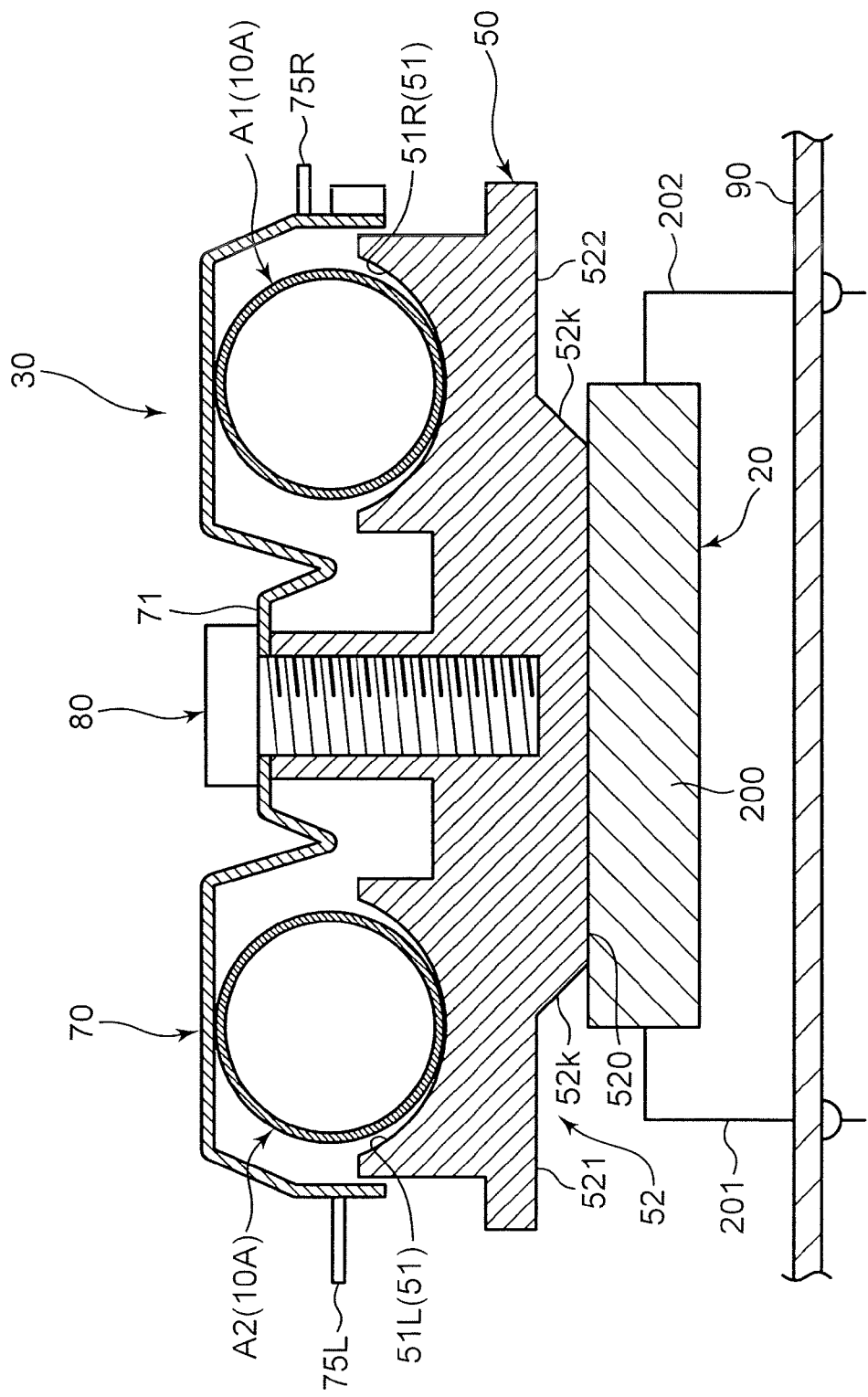
FIG. 6 is a cross-sectional view showing an arrangement of the refrigerant jacket, the pressing plate, the cooling portion of the refrigerant pipe, the power device and the printed wiring board.

As shown in FIG. 2 and FIG. 6, the cooling portion 10A has a first cooling portion A1 and a second cooling portion A2, which extend in the vertical direction in a mutually parallel attitude. The first cooling portion A1 and the second cooling portion A2 are connected via the curved section. The upstream side portion of the liquid pipe of the refrigerant pipe 10 which connects to the upstream side of the cooling portion 10A (the upstream side of the first cooling portion A1) extends upwards towards the power device 20 of the printed circuit board 91 inside the casing 5 (the upstream side portion extends upwards towards the refrigerant jacket 40), and the downstream side portion of the liquid pipe of the refrigerant pipe 10 which connects to the downstream side of the cooling portion 10A (the downstream side of the second cooling portion A2) extends downwards from the power device 20 of the printed circuit board 91 inside the casing 5 (the downstream side portion extends downwards towards the refrigerant jacket 40). The cooling portion 10A extends upwards along the refrigerant jacket 40.

Next, the refrigerant jacket 40 and the pressing plate 70 are described. The refrigerant jacket 40 is disposed in the region indicated by the double-dotted lines in FIG. 3. The refrigerant jacket 40 is integrated with the printed circuit board 91 and cools the power device 20 by means of refrigerant flowing in the cooling portion 10A, in a state where the cooling portion 10A has been installed. In the present embodiment, the refrigerant jacket 40 has a shape which is long in one direction (the vertical direction). More specifically, the dimension of the one direction of the refrigerant jacket 40 is greater than the dimension of the refrigerant jacket 40 in the direction perpendicular to the one direction (width direction). The lower end portion of the refrigerant jacket 40 is located at a position along the lower end portion of the printed wiring board 90. The lower end portion of the refrigerant jacket 40 is preferably at a position facing the lower end portion of the printed wiring board 90. The refrigerant jacket 40 extends upwards from the lower end portion of the refrigerant jacket 40.

Figure 7:
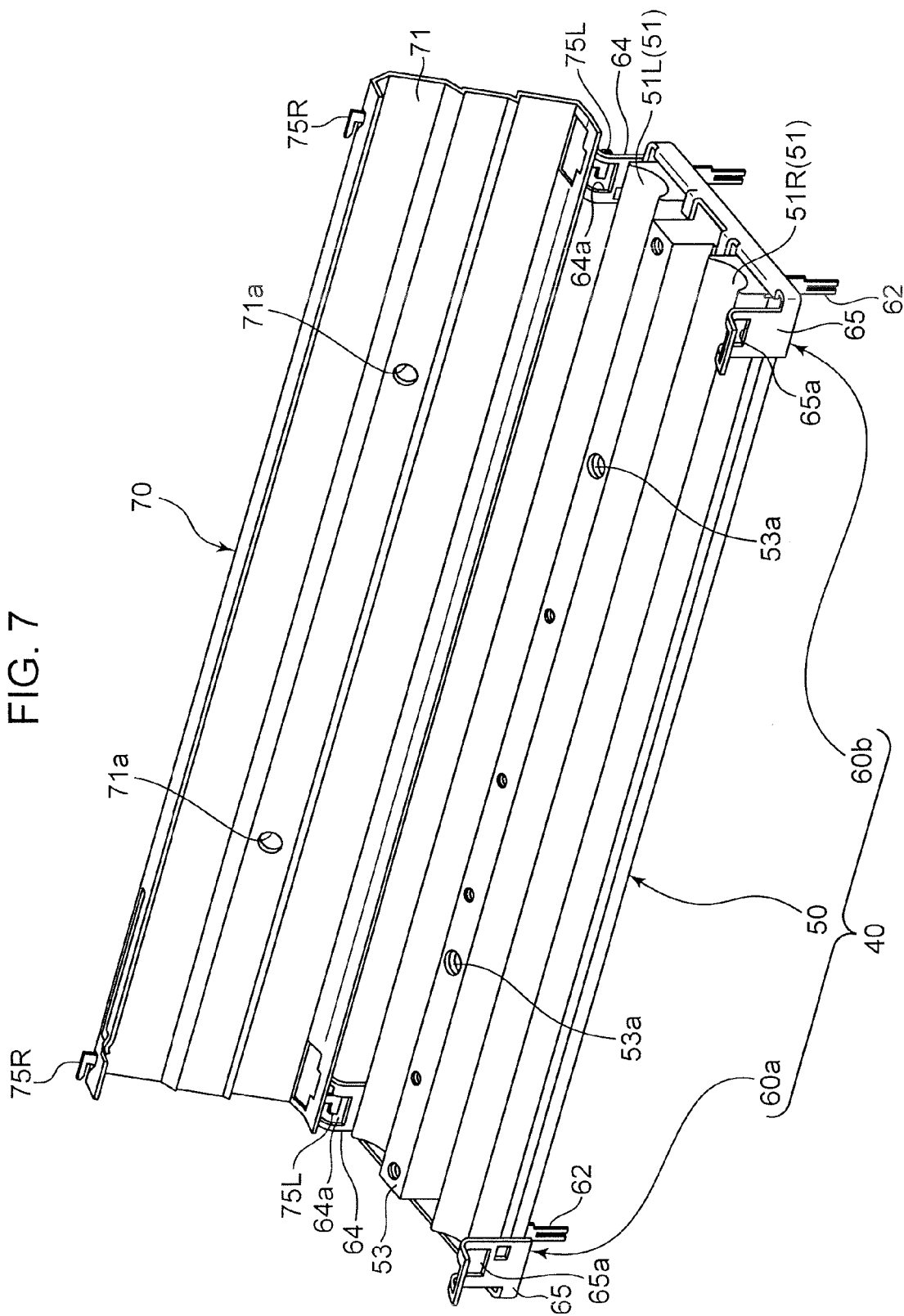
FIG. 7 is a perspective view of the refrigerant jacket in the outdoor unit, which shows a state in which the pressing plate of the refrigerant jacket is open.

As shown in FIG. 7, the refrigerant jacket 40 has a jacket main body 50 which is interposed between the cooling portion 10A of the refrigerant pipe 10 and the power device 20, and supporting legs 60a, 60b for installing the jacket main body 50 on the printed wiring board 90. The jacket main body 50 lies in contact with both the cooling portion 10A and the power device 20.

The jacket main body 50 is made from a material having high thermal conductivity, such as aluminum. The jacket main body 50 is formed by extrusion molding, and has a shape that is long in the one direction. The jacket main body 50 includes an installation and removal surface 51 and a facing surface 52. The facing surface 52 lies in contact with the power device 20. The facing surface 52 faces the printed wiring board 90 in a state of non-contact with the printed wiring board 90. The installation and removal surface 51 enables installation and removal of the cooling portion 10A of the refrigerant pipe 10 on the opposite side of the facing surface 52. In the present embodiment, the jacket main body 50 is formed in a flat shape having a small thickness. The installation and removal surface 51 is provided on one main surface of the jacket main body 50 in the thickness direction thereof, and the facing surface 52 is provided on the other main surface of the jacket main body 50 in the thickness direction thereof.

As shown in FIG. 7, a pair of grooves (pipe arrangement grooves) 51L, 51R extending in the one direction are provided in the installation and removal surface 51. These grooves 51L, 51R extend, parallel to each other, in the one direction. One of the first cooling portion A1 and the second cooling portion A2 of the cooling portion 10A is disposed in one groove 51R and the other of the first cooling portion A1 and the second cooling portion A2 is disposed in the other groove 51L.

Each of the inner surfaces of the grooves is a curved surface having a semi-circular column shape (a curved surface having a semi-circular arc-shaped cross-sectional form) (see FIG. 6). The diameter of this curved inner surface is substantially the same as or slightly larger than the diameter of the cooling portion 10A which has a circular cross-section. Accordingly, it is possible to achieve a large contact surface area between each of the inner surfaces of the grooves and the outer surface of the cooling portion 10A. Furthermore, by making the diameter of the inner surfaces of the respective grooves substantially the same as or slightly larger than the diameter of the cooling portion 10A, then the cooling portion 10A can readily be installed in and removed from the grooves 51L, 51R of the installation and removal surface 51.

Figure 8:
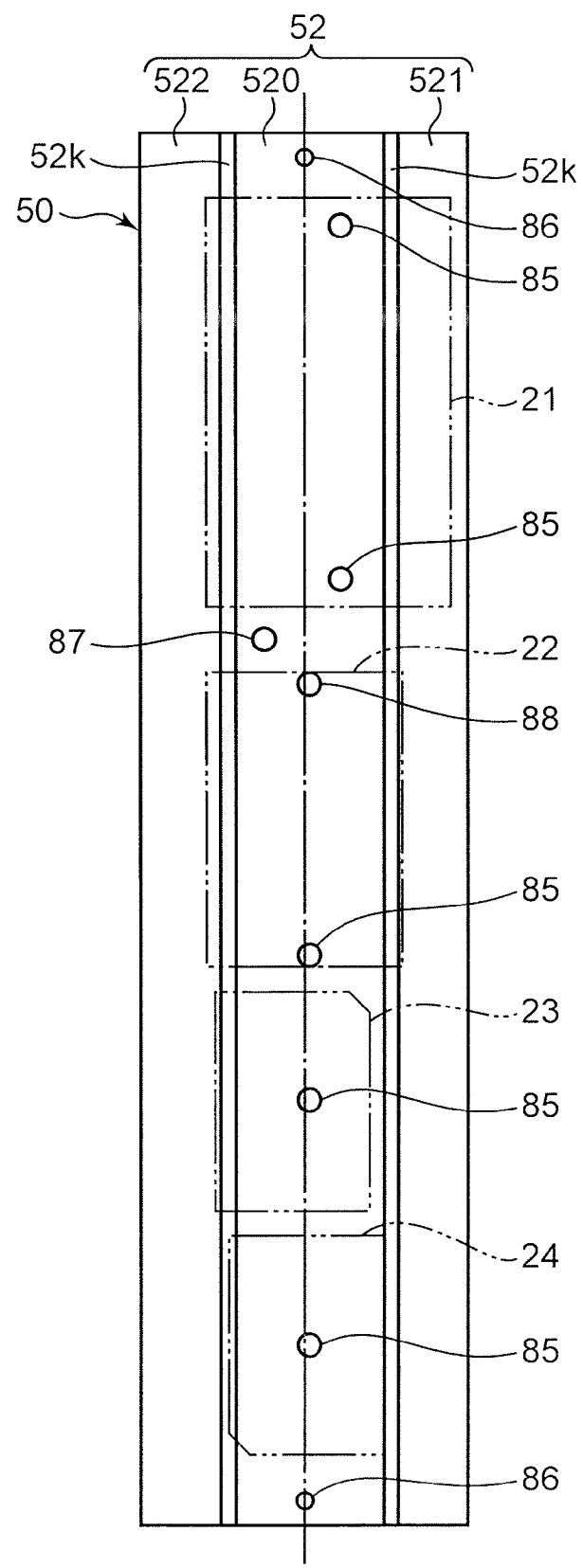
FIG. 8 is a rear view of a jacket main body of the refrigerant jacket

As shown in FIG. 6 and FIG. 8, the facing surface 52 includes a contact portion 520 which contacts the device main body 200 of the power device 20, a first recessed portion 521 and a second recessed portion 522. The contact portion 520 may also lie in contact with the device main body 200 via a coating material, such as grease, having high thermal conductivity. If the surface of the device main body 200 is a flat surface, then the contact portion 520 is desirably a flat surface, whereby the contact portion 520 makes surface contact with the surface of the device main body 200.

As shown in FIG. 8, a plurality of screw holes 85, 88 for fixing the power device 20 to the contact portion 520, a screw hole 87 for fixing the temperature detection unit T to the contact portion 520, and screw holes 86, 86 for fixing the supporting legs 60a. 60b to the jacket main body 50, are formed in the contact portion 520.

As shown in FIG. 5, FIG. 6 and FIG. 8, the first recessed portion 521 is situated at a position facing the first lead section 201. The first recessed portion 521 is positioned further away from the power device 20, than the contact portion 520. In other words, the first recessed portion 521 is a portion which is recessed so as to be positioned on the side of the installation and removal surface 51, with respect to the contact portion 520. Consequently, a distance (insulating distance) is guaranteed, by which the first recessed portion 521 and the first lead section 201 are in a mutually insulated state. The second recessed portion 522 is situated in a position opposing the second lead section 202. The second recessed portion 522 is positioned further away from the power device 20, than the contact portion 520. In other words, the second recessed portion 522 is a portion which is recessed so as to be positioned on the side of the installation and removal surface 51, with respect to the contact portion 520. Consequently, a distance (insulating distance) is guaranteed, by which the second recessed portion 522 and the second lead section 202 are in a mutually insulated state. The contact portion 520, the first recessed portion 521 and the second recessed portion 522 each extend in the one direction (the vertical direction in the present embodiment).

As shown in FIG. 5, the contact portion 520 is provided in a region including the centre line C which pass through the centre of the jacket main body 50 in the width direction.

The first recessed portion 521 is provided on one side of the contact portion 520 in the breadthways direction, and the second recessed portion 522 is provided on the other side of the contact portion 520 in the breadthways direction.

In the present embodiment, the second recessed portion 522 is provided at a position nearer to the centre line C than the first recessed portion 521. The first recessed portion 521 and the second recessed portion 522 are provided in such a manner that, when the jacket main body 50 is viewed from the rear side, the length L2 in the breadthways direction of the second recessed portion 522 is greater than the length L1 in the breadthways direction of the first recessed portion 521. Consequently, it is possible to ensure, more reliably, an insulating distance between the second lead section 202 which is connected to the heavy electric part 20P of the first inverter 21, and the second recessed portion 522, and an insulating distance between the second lead section 202 which is connected to the heavy electric part 20P of the second inverter 22, and the second recessed portion 522.

The length L0 in the breadthways direction of the contact portion 520 is greater than the length L1 and is greater than the length L2. Consequently, it is possible to raise the cooling efficiency by enlarging the surface area of contact with the power device 20.

As shown in FIG. 6, the end section 52K on the contact portion 520 side of the first recessed portion 521 is an inclined surface which is inclined with respect to the contact portion 520 so as to slope away from the contact portion 520 in a direction away from the first lead section 201. The end section 52K on the contact portion 520 side of the second recessed portion 522 is an inclined surface which is inclined with respect to the contact portion 520 so as to slope away from the contact portion 520 in a direction away from the second lead section 202. Consequently, it is possible to raise the capacity of the jacket main body 50 to transmit the heat of the power device 20 to the cooling portion 10A, compared to a case where the end sections 52K have a flat surface perpendicular to the contact portion 520, rather than an inclined surface. These inclined surfaces may be a flat surface, or a convex or concave curved surface, or the like.

Figure 9:
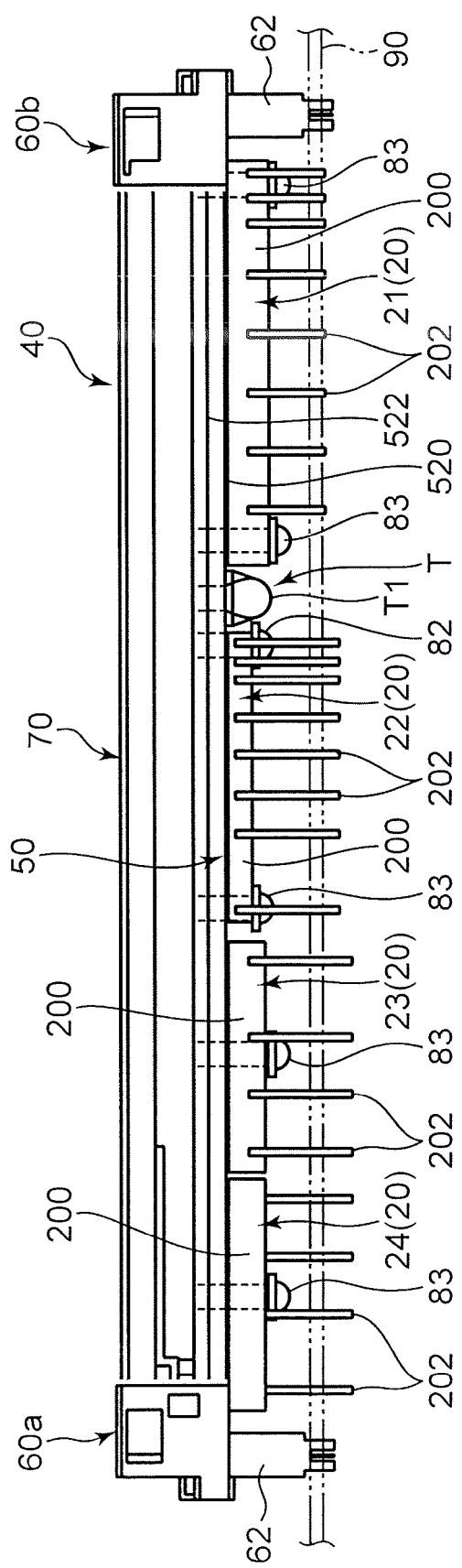
FIG. 9 is a side view showing the refrigerant jacket, the power device and the temperature detection unit.
Figure 10:
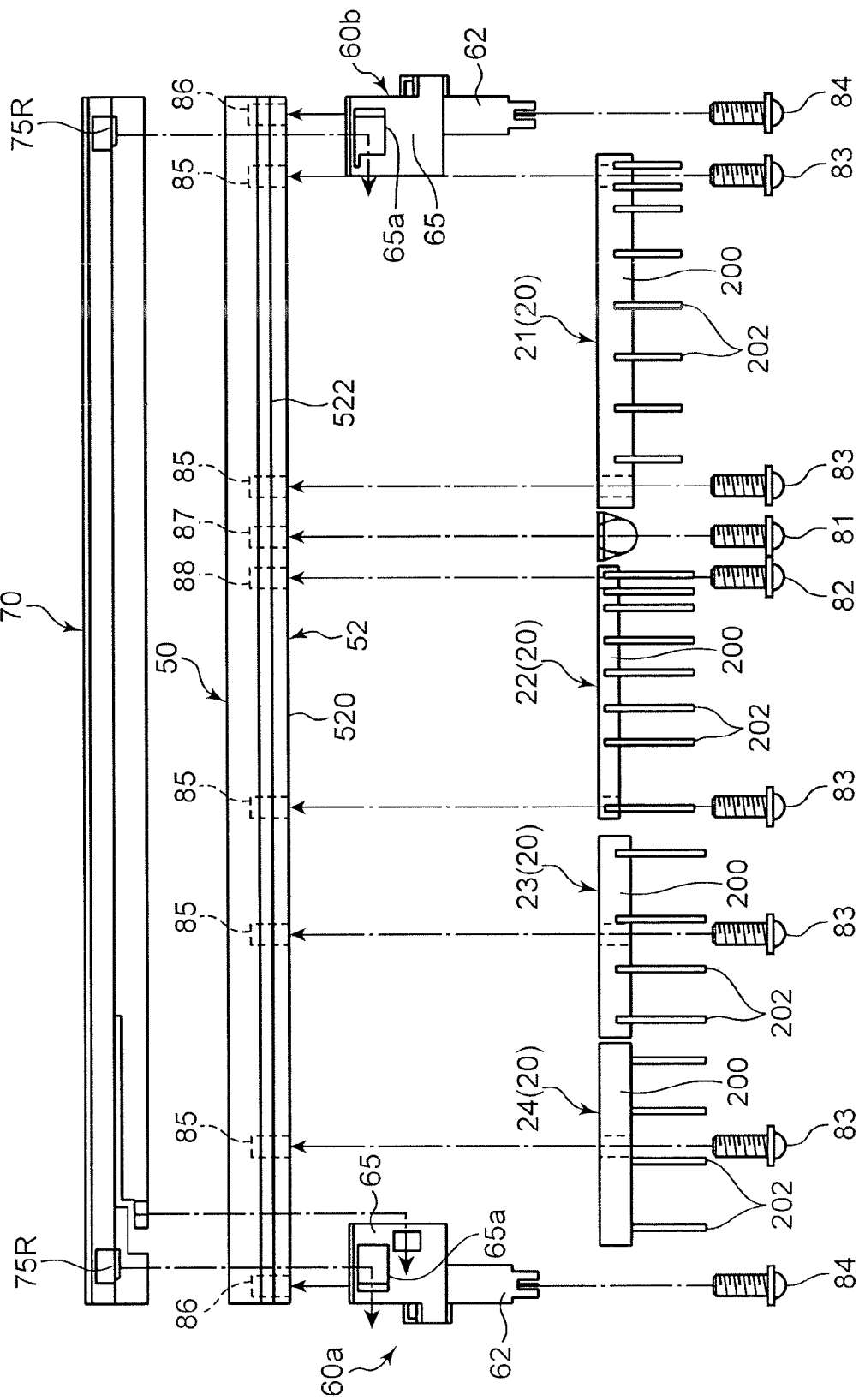
FIG. 10 is an exploded view of FIG. 9.

As shown in FIG. 9, the supporting legs 60a, 60b are used to install the jacket main body 50 on the printed wiring board 90. As shown in FIG. 10 and FIG. 7, the first supporting leg 60a is fixed by a screw 84 (see FIG. 10) which is screwed into the screw hole 86 in one end of the lengthwise direction of the jacket main body 50, and the second supporting leg 60b is fixed by a screw 84 (see FIG. 10) which is screwed into the screw hole 86 in the other end.

The first supporting leg 60a includes an installation section 62 for installing on the printed wiring board 90, a coupling section 64 which couples with the pressing plate 70 and serves as a rotating section when the pressing plate 70 opens and closes, and a coupling section 65 for maintaining the pressing plate 70 in the closed state. Similarly, the second supporting leg 60b includes an installation section 62 for installing on the printed wiring board 90, a coupling section 64 serves as a rotating section when the pressing plate 70 opens and closes, and a coupling section 65 for maintaining the pressing plate 70 in the closed state. The coupling section 64 is provided on one side in the breadthways direction of the pressing plate 70, and the coupling section 65 is provided on the opposite side from the coupling section 64, in the breadthways direction of the pressing plate 70.

Each of the installation sections 62 is set to a dimension which can guarantee a space for disposing a power device 20 between the surface of the printed wiring board 90 and the contact portion 520. The leading end sections of the installation sections 62 are fixed to the printed wiring board 90 (see FIG. 9). As shown in FIG. 7, the coupling sections 64 each have an insertion hole 64a into which the coupling section 75L of the pressing plate 70 (described below) is inserted. The coupling sections 65 each have an insertion hole 65a into which the coupling section 75R of the pressing plate 70 (described below) is inserted.

The pressing plate 70 serves to sandwich the cooling portion 10A of the refrigerant pipe 10, against the refrigerant jacket 40. The pressing plate 70 is installed on the installation and removal surface 51 side of the refrigerant jacket 40. The pressing plate 70 can assume a closed state of pressing the cooling portion 10A against the installation and removal surface 51 in a state where the cooling portion 10A of the refrigerant pipe 10 is sandwiched between the refrigerant jacket 40 and the pressing plate 70 (see FIG. 6 and FIG. 11), and an open state where the cooling portion 10A can be installed on and removed from the installation and removal surface 51 (see FIG. 7).

The pressing plate 70 has a long shape in the same direction as the lengthwise direction of the refrigerant jacket 40. In the present embodiment, the pressing plate 70 is formed from a single metal sheet, but the invention is not limited to this. The pressing plate 70 has a plate main body 71 which is pressed towards the refrigerant jacket 40 by the fixing tool 80, as well as covering the cooling portion 10A, and the coupling sections 75L, 75R described above. The coupling sections 75L, 75R have a portion extending in the breadthways direction of the pressing plate 70 and a portion extending in the lengthwise direction. In other words, the coupling sections 75L, 75R each have an L-shaped portion.

This pressing plate 70 has a rigidity which permits correction of twisting of the cooling portion 10A of the refrigerant pipe 10 when the plate main body 71 is pressed towards the refrigerant jacket 40 by the fixing tool 80. This plate main body 71 has an insertion hole 71a for inserting a shaft section of the fixing tool 80. Due to the shaft section of the fixing tool 80 which has been inserted into the insertion hole 71a being fixed to the fixing tool installation section 53a of the jacket main body 50, the plate main body 71 is pressed towards the cooling portion 10A.

Figure 11:
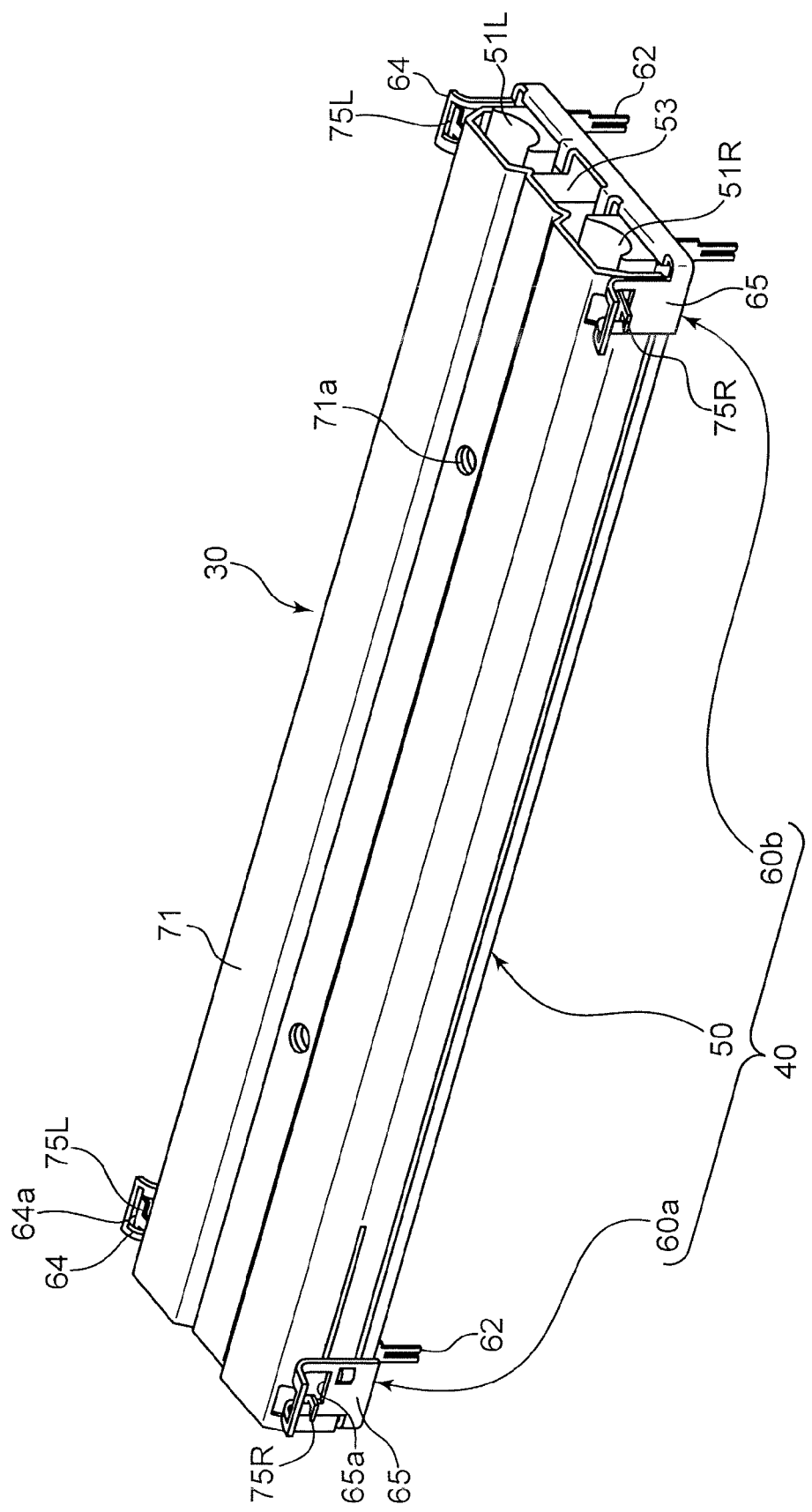
FIG. 11 is a perspective view of the refrigerant jacket, which shows a state in which the pressing plate of the refrigerant jacket is closed.

The procedure for installing the pressing plate 70 on the refrigerant jacket 40 is as follows. Firstly, as shown in FIG. 7, the coupling sections 75L of the pressing plate 70 are inserted into the insertion hole 64a of the corresponding coupling section 64 of the refrigerant jacket 40, thereby coupling these members together (open state). Thereupon, the pressing plate 70 is rotated about the coupled portion of the coupling section 64 and the coupling section 75L. By this means, as shown in FIG. 11, the pressing plate 70 comes to face the installation and removal surface 51 of the refrigerant jacket 40 (closed state). In FIG. 11, the cooling portion 10A of the refrigerant pipe 10 is not depicted, but as shown in FIG. 6, the cooling portion 10A is interposed between the refrigerant jacket 40 and the pressing plate 70, and by assuming the abovementioned closed state, the cooling portion 10A is pressed against the installation and removal surface 51 of the refrigerant jacket 40, and the cooling portion 10A makes surface contact with the installation and removal surface 51.

In the closed state, the coupling sections 75L, 75R of the pressing plate 70 are inserted into the insertion holes 65a of the corresponding coupling sections 65. In this case, by a sliding movement of the pressing plate 70 in the lengthwise direction thereof, the L-shaped portions of the coupling sections 75L, 75R are more securely coupled to the corresponding insertion holes.

The temperature detection unit T serves to detect the temperature of the power device 20. In the present embodiment, the temperature detection unit T is a thermistor (fin thermistor), but the temperature detection unit T is not limited to being a thermistor, provided that it is capable of detecting the temperature of the power device 20.

As shown in FIG. 5 and FIG. 9, the temperature detection unit T is installed on the facing surface 52 of the refrigerant jacket 40. In particular, in the present embodiment, the temperature detection unit T is installed on the contact portion 520 of the facing surface 52. Furthermore, the temperature detection unit T is disposed at a position nearer to the inverters 21, 22 than the converters 23, 24. The temperature detection unit T is disposed between the first inverter 21 and the second inverter 22. The first inverter 21 and the second inverter 22 are spaced apart so as to enable the arrangement of the temperature detection unit T therebetween.

The temperature detection unit T includes a screw fastening section T1 having a screw hole T3 into which a first screw 81 is inserted, and an extension section T2 which extends along the facing surface 52 from the screw fastening section T1. The temperature detection unit T has a shape which is long in the direction along the facing surface 52, and is disposed so as to extend along the contact portion 520. The temperature detection unit T is fixed to the jacket main body 50 by the first screw 81 which is screw fitted into the screw hole 87 formed in the contact portion 520 of the jacket main body 50. As shown in FIG. 5, a long thin wire W is connected to the temperature detection unit T in order to carry the detected signal to the printed circuit board 91. The end of the wire W of the temperature detection unit T is connected to the printed circuit board 91 of the electric component module 100.

Here, as shown in FIG. 5, FIG. 8, FIG. 9 and FIG. 10, the device main body 200 of the first inverter 21 is fixed to the jacket main body 50 by the screws 83 which are screw fitted into the screw holes 85 formed in the contact portion 520 of the jacket main body 50. The device main body 200 of the first converter 23 is fixed to the jacket main body 50 by the screws 83 which screw fit into the screw holes 85 formed in the contact portion 520. The device main body 200 of the second converter 24 is fixed to the jacket main body 50 by the screws 83 which screw fit into the screw holes 85 formed in the contact portion 520.

The device main body 200 of the second inverter 22 is fixed to the jacket main body 50 by the screws 83 which are screw fitted into the screw holes 85 formed in the contact portion 520 of the jacket main body 50, and a second screw 82 which is screw fitted into a screw hole 88. As shown in FIG. 5 and FIG. 11 this second screw 82 is provided at a position which restricts rotation of the temperature detection unit T about the screw hole T3, due to the extension section T2 of the temperature detection unit T abutting against the second screw 82.

In other words, the second screw 82 serves both a function of fixing the second inverter 22 to the jacket main body 50 and a function of restricting rotation of the temperature detection unit T. Consequently, in the step of installing the temperature detection unit T on the installation and removal surface 51, the first screw 81 which has been inserted into the screw hole T3 of the screw fastening section T1 is rotated by a tool, and when screw fixing the first screw 81 into the screw hole 87, further rotation of the temperature detection unit T about the screw hole T3 is restricted due to the extension section T2 abutting against the second screw 82.

In an air-conditioning apparatus 1 such as that described above, when a refrigeration cycle is implemented, the power device 20 is driven and the heat generating section thereof generates heat, but the power device 20 is cooled by the cooler 30. In other words, the power device 20 is cooled by exchange of heat with the refrigerant flowing in the cooling portion 10A, via the refrigerant jacket 40 and the cooling portion 10A of the refrigerant pipe 10. Moreover, since the temperature detection unit T is installed on the contact portion 520 of the facing surface 52 of the refrigerant jacket 40, then it is possible to detect the temperature of the power device 20 with good accuracy.

As described above, in the present embodiment, since both of the heavy electric component group and the light electric component group are installed on the main surface 90a which faces the opening that appears when the portion of the casing 5 is removed, of the front and rear pair of main surfaces of the printed wiring board 90, then it is possible to suppress increase in the size of the printed wiring board 90 in the thickness direction. Moreover, since both of the heavy electric component group and the light electric component group are installed on the main surface 90a which faces towards the opening, then excellent workability is achieved during initial setting and maintenance and other servicing.

In the present embodiment, since the devices, such as the compressor 12, are disposed near the bottom plate 6 of the casing 5, then a large part of the refrigerant pipe 10 is disposed in the lower part of the casing 5. In the present embodiment, the electric component module 100 is provided in a position above the compressor 12. The heavy electric region where the heavy electric component group is disposed is provided in a region in the lower part of the main surface 90a of the printed wiring board 90. Therefore, it is possible to suppress increase in the length (pipe length) through which the refrigerant pipe 10 extends until reaching the heavy electric region, since the cooling portion 10A which is one portion of the refrigerant pipe 10 is arranged in the heavy electric region of the printed wiring board 90 via the refrigerant jacket 40. In a layout of this kind where the refrigerant jacket 40 is disposed in the lower part of the printed wiring board 90, the cooling portion 10A of the refrigerant pipe 10 can be positioned easily with respect to the refrigerant jacket 40. Furthermore, by suppressing increase in the pipe length in this way, the corresponding space inside the casing 5 can be used for other purposes.

In the present embodiment, the input wire section 96 for the power source is disposed on one side of the power device 20, and the output wire section 97 for the inverters 21, 22 is disposed on the other side of the power device 20. In this way, in the heavy electric region, the input wire section 96, the power device 20 and the output wire section 97 are arranged in this order, and therefore it is possible to separate (to divide) the position where the input wire section 96 is provided and the position where the output wire section 97 is provided. By adopting a layout of this kind, noise is prevented from becoming mixed into the output from the output wire section 97 for the inverter, and therefore it is possible to raise the noise reducing effect.

In the present embodiment, the refrigerant jacket 40 has a shape which extends upwards from a position facing the lower end portion of the printed wiring board 90, and the cooling portion 10A of the refrigerant pipe 10 extends upwards along the refrigerant jacket 40. Therefore, it is possible to further suppress increase in the length (pipe length) through which the refrigerant pipe 10 extends until reaching the refrigerant jacket 40 that lies in contact with the power device 20 in the heavy electric region.

Furthermore, in the present embodiment, the refrigerant pipe 10 which is disposed so as to face the printed wiring board 90 is bent in a U-shape, as shown in FIG. 2. Of this U-shaped portion, the portion apart from the end of the bent section situated above the refrigerant jacket 40 functions as the cooling portion 10A. The U-shaped portion is arranged in such a manner that the end of the bent section is positioned upper most. The part of the U-shaped portion apart from the upper end of the bent section, in other words, the cooling portion 10A, is disposed so as to face the printed wiring board 90 via the refrigerant jacket 40. Consequently, the portion which directly faces the printed wiring board 90 (the portion which faces the board without an intervening member) is only the upper end part of the bent section of the U-shaped portion. In this way, in the present embodiment, it is possible to reduce, as far as possible, the region where the refrigerant pipe 10 is arranged so as to face the electronic components mounted on the printed wiring board 90, without an intervening member therebetween. Consequently, it is possible to further raise the working efficiency during servicing, such as maintenance, of the heavy electric component group and the light electric component group.

Other Embodiments

The present invention is not limited to the embodiment described above and various modifications, improvements, and the like can be applied within a scope that does not depart from the essence of the invention.

In the embodiment described above, an example is given in which the power device 20 includes two inverters 21, 22 and two converters 23, 24, but the invention is not limited to this. For instance, the power device 20 may include one inverter and one converter. Furthermore, the power device 20 may include three or more inverters and three or more converters.

In the embodiment described above, an example is given in which the input wire section 96 is disposed on one side of the power device 20, and the output wire section 97 is disposed on the other side of the power device 20, but the invention is not limited to this. The input wire section 96 and the output wire section 97 may be provided on the same side with respect to the power device 20.

In the embodiment described above, an example is given in which the refrigerant jacket 40 has a shape extending upwards from a position facing the lower end part of the printed wiring board 90, but the refrigerant jacket 40 does not necessarily have to be provided in a position facing the lower end part of the printed wiring board 90.

In the present embodiment, an example is given in which the cooling portion 10A of the refrigerant pipe 10 is disposed in the groove of the refrigerant jacket 40, but the invention is not limited to this. Provided that a large contact surface area can be obtained between the cooling portion 10A and the refrigerant jacket 40, the refrigerant jacket 40 does not necessarily have to be provided with grooves.

In the embodiment described above, an example is given in which the pressing plate 70 has a size that is capable of covering substantially the whole of the jacket main body 50, but the invention is not limited to this. The pressing plate 70 is required to be capable of pressing the cooling portion 10A of the refrigerant pipe 10 against the installation and removal surface 51, and therefore the pressing plate 70 may be smaller than the jacket main body 50.

In the embodiment described above, an example is given in which screws are screw fitted into screw holes as means for installing the power device 20 on the facing surface 52, but the invention is not limited to this, and it is also possible to use another fixing means.

In the embodiment described above, an example is given in which the refrigerant jacket 40 includes a jacket main body 50 and supporting legs 60a, 60b, and the jacket main body 50 and the supporting legs 60a, 60b are separate bodies, but the invention is not limited to this. For example, the jacket main body 50 and the supporting legs 60a, 60b may be formed in an integrated fashion.

In the embodiment described above, an example is given in which the refrigeration apparatus is an air-conditioning apparatus, but the invention is not limited to this. The refrigeration apparatus may be, for example, a hot water supply apparatus or a cooling apparatus, or the like, which is provided with a water-cooling type of heat exchanger, instead of the air-cooling type of indoor heat exchanger 11.

In the embodiment described above, an example is given in which one main surface 90a of the printed wiring board 90 faces towards the opening that appears when one portion of the casing 5 is removed, but the invention is not limited to this. For example, if the front surface side opens when the front surface side plate of the casing 5 is removed, then the one main surface 90a of the printed wiring board 90 may face the rightward direction, the leftward direction or the rearward direction, for example.

An overview of the embodiments described above is as follows.

The present refrigeration apparatus relates to a refrigeration apparatus having a refrigerant circuit. The refrigeration apparatus includes: a heavy electric component group including a power device; a light electric component group; a printed wiring board, on one main surface of which the heavy electric component group and the light electric component group are mounted, the printed wiring board being disposed in a vertical direction; a refrigerant pipe through which a refrigerant of the refrigerant circuit flows; and a refrigerant jacket cooling the power device by a refrigerant flowing in a cooling portion which is one portion of a liquid pipe of the refrigerant pipe. The main surface of the printed wiring board includes: a heavy electric region which is a region in the lower part of the printed wiring board where the heavy electric component group is disposed; and a light electric region which is a region situated above the heavy electric region, where the light electric component group is disposed. The refrigerant jacket contacts the power device arranged in the heavy electric region. The liquid pipe of the refrigerant pipe includes a portion extending upwards towards the refrigerant jacket, and the cooling portion contacts the refrigerant jacket.

In this composition, since both the heavy electric component group and the light electric component group are mounted on one main surface, of the front/rear pair of main surfaces of the printed wiring board, then it is possible to suppress increase in the size of the printed wiring board in the thickness direction. Furthermore, since both the heavy electric component group and the light electric component group are mounted on one main surface, then electronic components only need to be mounted on one surface (main surface 90a). Therefore, a merit is obtained in terms of the manufacturing costs, compared to a case where electronic components are mounted on both surfaces.

Furthermore, in general, in a refrigeration apparatus, the liquid pipe of the refrigerant pipe is disposed in the lower part of the interior of the casing. Therefore, simply by providing a portion of the liquid pipe disposed in the lower part inside the casing, so as to extend upwards, it is possible to dispose the cooling portion, which is one portion of the liquid pipe, so as to face the heavy electric region of the printed wiring board. Moreover, with the present composition, the heavy electric region in which the heavy electric component group is disposed is provided in a region in the lower part of the main surface of the printed wiring board which is disposed in a vertical direction. Therefore, the length (pipe length) through which the refrigerant pipe extends in order to dispose the cooling portion so as to face the heavy electric region can be made shorter than in a case where the heavy electric region is provided in the upper part of the main surface of the printed wiring board. Since the arrangement of the liquid pipe can be simplified in this way, then it is possible to keep the space required for arrangement of the liquid pipe to a compact size.

From the above, with this composition, it is possible to suppress increase in restrictions on the space for arranging various devices inside the casing.

In the refrigeration apparatus, desirably, the heavy electric component group further includes: an input wire section for a power source; and an output wire section for the inverter; and the input wire section is disposed on one side of the power device; and the output wire section is disposed on the other side of the power device.

With this composition, in the heavy electric region, the input wire section, the power device and the output wire section are arranged in this order, and therefore it is possible to separate (divide) the position where the input wire section is provided and the position where the output wire section is provided. By adopting a layout of this kind, mixing of noise into the output from the output wire section for the inverter is suppressed. More specifically, in the present composition, it is possible to improve the noise reducing effects.

In the refrigeration apparatus, desirably, the refrigeration jacket has a shape extending upwards from a position facing the lower end part of the printed wiring board; and the cooling portion of the refrigerant pipe extends upwards along the refrigerant jacket.

With this composition, since the lower end portion of the refrigerant jacket is situated at a position facing the lower end portion of the printed wiring board, then it is possible to further suppress increase in the length (pipe length) through which the refrigerant pipe extends, until reaching the position of the refrigerant jacket which contacts the power device in the heavy electric region.

In the heavy electric region of the refrigeration apparatus, desirably, a wiring pattern for a current detection signal is provided so as not to intersect with a wiring pattern for a power system.

Normally, the current detection signal is a signal of low voltage, and therefore is susceptible to the effects of the current of the heavy electric system which is flowing in the wiring pattern for the power system that connects the capacitors and inverters, for example. Supposing that the wiring pattern for the current detection signal were to be provided so as to intersect with the wiring pattern for the power system, then the current detection signal would be greatly affected by the power system and become liable to include noise.

On the other hand, with the present composition, the wiring pattern for the current detection signal that connects the shunt resistance and the operational amplifier, for example, is provided so as not to intersect with the wiring pattern for the power system, and therefore it is possible to suppress the inclusion of noise in the current detection signal.

In the refrigeration apparatus, desirably, the one main surface faces towards an opening that appears when one portion of the casing is removed.

With this composition, since the main surface on which both the heavy electric component group and the light electric component group are mounted faces towards the opening which appears when a portion of the casing is removed, then excellent workability is obtained in service operations such as maintenance of the heavy electric component group and the light electric component group, and excellent workability is also obtained in initial settings, and so on.

1 air-conditioning apparatus
2 outdoor unit
3 indoor unit
4 refrigerant circuit
10 refrigerant pipe
10A cooling portion of refrigerant pipe
10L liquid pipe
10G gas pipe
20 power device
21 first inverter
22 second inverter
23 first converter
24 second converter
30 cooler
40 refrigerant jacket
70 pressing plate
90 printed wiring board
91 printed circuit board
96 input wire section
97 output wire section
100 electric component module
R1 heavy electric region
R2 light electric region

The invention claimed is:

1. A refrigeration apparatus having a refrigerant circuit, comprising:
    a heavy electric component group including a power device;
    a light electric component group;
    a printed wiring board, on one main surface of which the heavy electric component group and the light electric component group are mounted, the printed wiring board being disposed in a vertical direction;
    a refrigerant pipe through which a refrigerant of the refrigerant circuit flows; and
    a refrigerant jacket cooling the power device by the refrigerant flowing in a cooling portion which is one portion of a liquid pipe of the refrigerant pipe, wherein
    the main surface of the printed wiring board includes:
    a heavy electric region which is a region in a lower part of the printed wiring board where the heavy electric component group is disposed; and
    a light electric region which is a region situated above the heavy electric region, where the light electric component group is disposed, and wherein
    the refrigerant jacket contacts the power device arranged in the heavy electric region; and
    the liquid pipe of the refrigerant pipe includes a portion extending upwards towards the refrigerant jacket, and the cooling portion contacts the refrigerant jacket,
    the power device includes a plurality of inverters and converters,
    the plurality of inverters and converters are aligned in one row in the vertical direction on the heavy electric region of the printed wiring board, and
    the refrigerant jacket and the cooling portion of the refrigerant pipe extend in the direction in which the plurality of inverters and converters align.

2. The refrigeration apparatus according to claim 1, wherein
    the heavy electric component group further includes:
    an input wire section for a power source; and
    an output wire section for the inverter, and
    the input wire section is disposed on one side of the power device; and
    the output wire section is disposed on the other side of the power device.

3. The refrigeration apparatus according to claim 1, wherein
    the refrigerant jacket has a shape extending upwards from a position facing the lower end part of the printed wiring board; and
    the cooling portion of the refrigerant pipe extends upwards along the refrigerant jacket.

4. The refrigeration apparatus according to claim 1, wherein a wiring pattern for a current detection signal is provided so as not to intersect with a wiring pattern for a power system, in the heavy electric region.

5. The refrigeration apparatus according to claim 1, wherein the one main surface is oriented towards an opening that appears when one portion of a casing is removed.

* * * * *